United States Patent
Fujita et al.

(10) Patent No.: US 10,148,418 B2
(45) Date of Patent: Dec. 4, 2018

(54) RECEIVING DEVICE

(71) Applicant: THINE ELECTRONICS, INC., Tokyo (JP)

(72) Inventors: Yusuke Fujita, Tokyo (JP); Satoshi Miura, Tokyo (JP); Shunichi Kubo, Chiyoda-ku (JP)

(73) Assignee: THINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 15/302,068

(22) PCT Filed: Mar. 11, 2015

(86) PCT No.: PCT/JP2015/057152
§ 371 (c)(1),
(2) Date: Oct. 5, 2016

(87) PCT Pub. No.: WO2015/156077
PCT Pub. Date: Oct. 15, 2015

(65) Prior Publication Data
US 2017/0118010 A1    Apr. 27, 2017

(30) Foreign Application Priority Data

Apr. 9, 2014    (JP) ................. 2014-079955

(51) Int. Cl.
H04L 7/00    (2006.01)
H04L 7/033    (2006.01)
H03L 7/08    (2006.01)

(52) U.S. Cl.
CPC .......... H04L 7/0083 (2013.01); H03L 7/0807 (2013.01); H04L 7/0066 (2013.01); H04L 7/033 (2013.01); H04L 7/0331 (2013.01)

(58) Field of Classification Search
CPC ....... H04L 7/0083; H04L 7/0331; H03L 7/14; G11B 20/1403
(Continued)

(56) References Cited

U.S. PATENT DOCUMENTS 5,557,648 A * 9/1996 Ishihara ............... H03L 7/14
                                                       331/1 A
5,648,964 A    7/1997 Inagaki et al.
(Continued)

FOREIGN PATENT DOCUMENTS

CN    102474411 A    5/2012
JP    62256521 A    11/1987
(Continued)

OTHER PUBLICATIONS

International Search Report, issued by the International Searching Authority in corresponding International Application No. PCT/JP2015/057152, dated Jun. 2, 2015.
(Continued)

Primary Examiner — Phuong Phu
(74) Attorney, Agent, or Firm — Sughrue Mion, PLLC

(57) ABSTRACT

A receiving device 20 includes a voltage controlled oscillator 22, a sampling unit 23, a control voltage generating unit 24, an error detecting unit 25, and a control voltage holding unit 26. The control voltage holding unit 26 holds a value of a control voltage Vc output from the control voltage generating unit 24. When the error detecting unit 25 detects an error of a digital signal, a control voltage held before error detection is provided to the voltage controlled oscillator 22.

6 Claims, 3 Drawing Sheets

(58) Field of Classification Search
USPC .................. 375/355, 257, 326, 327, 373–376
See application file for complete search history.

(56) References Cited

U.S. PATENT DOCUMENTS

| | | | |
|---|---|---|---|
| 6,775,344 B1 * | 8/2004 | Buhler | ............... G11B 20/1403 |
| | | | 375/340 |
| 8,331,513 B2 | 12/2012 | Ozawa | |
| 2011/0025913 A1 | 2/2011 | Sugiyama | |
| 2013/0191679 A1 | 7/2013 | Zhuang et al. | |

FOREIGN PATENT DOCUMENTS

| | | | |
|---|---|---|---|
| JP | 63276921 A | 11/1988 | |
| JP | 10154973 A | 6/1998 | |
| JP | 4754159 B2 | 8/2011 | |
| JP | 2012205204 A | 10/2012 | |
| WO | 2008/069555 A1 | 6/2008 | |
| WO | 2009060763 A1 | 5/2009 | |

OTHER PUBLICATIONS

International Preliminary Report on Patentability issued from the International Bureau in counterpart International Application No. PCT/JP2015/057152, dated Oct. 20, 2016.
Communication dated Apr. 24, 2018 from the Japanese Patent Office in counterpart Application No. 2014-079955.

* cited by examiner

RECEIVING DEVICE

CROSS REFERENCE TO RELATED APPLICATIONS

This application is a National Stage of International Application No. PCT/JP2015/057152 filed Mar. 11, 2015, claiming priority based on Japanese Patent Application No. 2014-079955 filed Apr. 9, 2014, the contents of all of which are incorporated herein by reference in their entirety.

TECHNICAL FIELD

The present invention relates to a receiving device.

BACKGROUND ART

Clock data recovery (CDR) technology for transmitting a digital signal in which clock information is embedded in data from a transmitting device to a transmission path and recovering data and a clock in a receiving device receiving the digital signal arriving through the transmission path is known (see Patent Literature 1). In the CDR technology, the receiving device generates the recovered data by sampling the digital signal according to the recovered clock and generates the recovered clock by performing feedback control so that a phase and a frequency match between the digital signal or the recovered data and the recovered clock.

CITATION LIST

Patent Literature

[Patent Literature 1] PCT International Publication No. WO 2009/060763

SUMMARY OF INVENTION

Technical Problem

When a transmitting/receiving system including a transmitting device and a receiving device adopting the CDR technology transmits a digital signal from the transmitting device to the receiving device via a transmission path, noise may temporarily overlap the digital signal due to an external factor such as static electricity. In this case, when data and a clock are assumed to be recovered on the basis of the digital signal overlapping the noise according to feedback control, the receiving device recovers a clock having a frequency/phase significantly different from an original frequency/phase and recovers data having a value different from an original value.

After the overlap of noise in the digital signal is eliminated, the receiving device can recover a clock having an original frequency/phase and data having an original value on the basis of a digital signal which does not overlap noise according to feedback control. However, in the conventional technology, recovering the original data and clock from the digital signal after the overlap of temporary noise in the digital signal is eliminated may be time-consuming.

The present invention has been made to solve the above-described problem, and an objective of the present invention is to provide a receiving device capable of shortening a time required to recover the original data and clock from a digital signal after the temporary overlap of noise in the digital signal is eliminated.

Solution to Problem

A receiving device of the present invention is a receiving device for receiving a digital signal transmitted from a transmitting device and arriving via a transmission path, the receiving device including: a voltage controlled oscillator configured to input a control voltage and output a clock of a frequency according to a value of the control voltage; a sampling unit configured to input the digital signal, input the clock output from the voltage controlled oscillator, and sample and hold data of the digital signal at a timing indicated by the clock to output the sampled and held data; a control voltage generating unit configured to obtain a phase or frequency difference between the digital signal or the data and the clock and generate the control voltage having a value of a small difference to output the generated control voltage to the voltage controlled oscillator; an error detecting unit configured to detect an error of the digital signal; and a control voltage holding unit configured to hold a value of the control voltage output from the control voltage generating unit and provide a control voltage held before error detection to the voltage controlled oscillator when the error detecting unit detects an error of the digital signal.

Preferably, the receiving device of the present invention prohibits the application of the control voltage from the control voltage generating unit to the voltage controlled oscillator when the error detecting unit detects the error of the digital signal. Also, preferably, the control voltage holding unit includes an amplifier having a first input terminal, a second input terminal, and an output terminal and holds a control voltage in the first input terminal, and the second input terminal and the output terminal are connected to each other and provide a voltage value of the output terminal to the voltage controlled oscillator.

In the receiving device of the present invention, the error detecting unit may detect the error of the digital signal on the basis of a pattern of data output from the sampling unit, and detect the error of the digital signal on the basis of a voltage value of the received digital signal.

A transmitting/receiving system of the present invention is a transmitting/receiving system including: a transmitting device configured to transmit a digital signal; and the above-described receiving device of the present invention configured to receive the digital signal transmitted from the transmitting device and arriving via the transmission path.

Advantageous Effects of Invention

According to the present invention, it is possible to shorten a time required to recover the original data and clock from a digital signal after the temporary overlap of noise in the digital signal is eliminated.

DESCRIPTION OF EMBODIMENTS

Hereinafter, modes for carrying out the present invention will be described in detail with reference to the accompanying drawings. The same elements are denoted by the same reference signs in the description of the drawings and redundant description thereof will be omitted.

Figure 1:
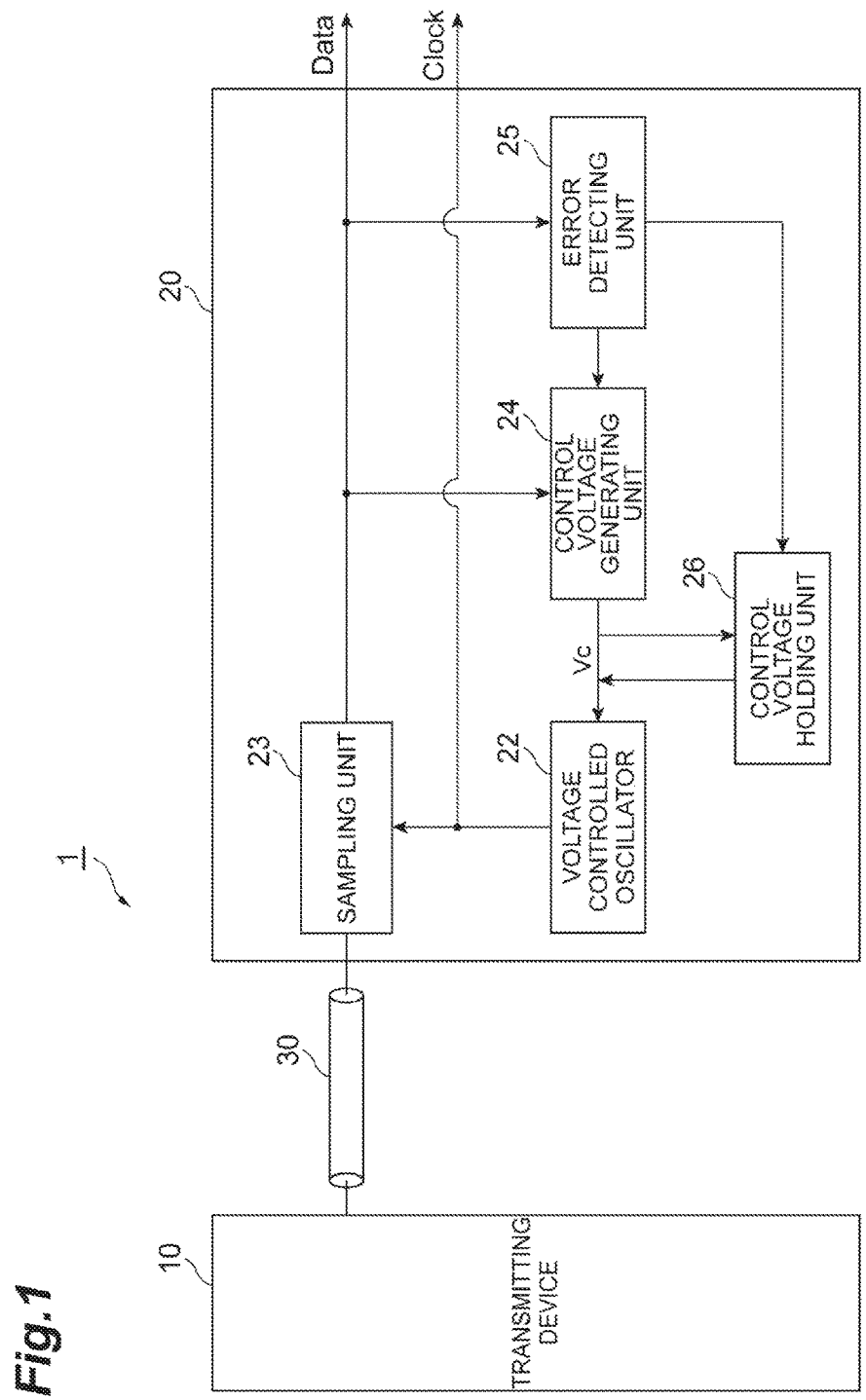
FIG. 1 is a diagram illustrating a configuration of a transmitting/receiving system 1 of the present embodiment.

FIG. 1 is a diagram illustrating a configuration of a transmitting/receiving system 1 of the present embodiment. The transmitting/receiving system 1 includes a transmitting device 10 and a receiving device 20. The transmitting device 10 and the receiving device 20 are connected by a transmission path 30. The transmitting device 10 transmits a digital signal in which clock information is embedded in data to the transmission path 30. The receiving device 20 receives a digital signal arriving through the transmission path 30 to recover data and a clock on the basis of the digital signal.

The receiving device 20 includes a voltage controlled oscillator 22, a sampling unit 23, a control voltage generating unit 24, an error detecting unit 25, and a control voltage holding unit 26. The voltage controlled oscillator 22 inputs a control voltage Vc output from the control voltage generating unit 24 and outputs a clock of a frequency according to a value of the control voltage Vc. The sampling unit 23 inputs the received digital signal, inputs the clock output from the voltage controlled oscillator 22, and sample and holds data of the digital signal at a timing indicated by the clock to output the sampled and held data.

The control voltage generating unit 24 obtains a phase or frequency difference between the data output from the sampling unit 23 and the clock output from the voltage controlled oscillator 22. The control voltage generating unit 24 generates the control voltage Vc having a small difference to output the generated control voltage Vc to the voltage controlled oscillator 22.

The voltage controlled oscillator 22, the sampling unit 23, and the control voltage generating unit 24 constitute a feedback loop. According to this feedback loop, the phase and frequency differences between the data output from the sampling unit 23 and the clock output from the voltage controlled oscillator 22 are controlled to be small. The clock output from the voltage controlled oscillator 22 in this state becomes a clock recovered on the basis of the received digital signal. Also, the data output from the sampling unit 23 becomes data recovered on the basis of the received digital signal.

The error detecting unit 25 detects an error of the digital signal. The error detecting unit 25 can detect the error of the digital signal on the basis of a pattern of the data output from the sampling unit 23. In a pattern of data after encoding (for example, 8B10B encoding) is performed, levels of a predetermined number of successive bits are not the same as a result subject to constraints based on the encoding and an average value of the levels of the predetermined number of successive bits does not deviate from a predetermined range. Therefore, the error detecting unit 25 can detect that the digital signal is erroneous when the pattern of the data output from the sampling unit 23 deviates from its constraint condition.

The control voltage holding unit 26 holds a value of the control voltage Vc output from the control voltage generating unit 24 and provides a control voltage held before error detection to the voltage controlled oscillator 22 when the error detecting unit 25 detects an error of the digital signal. When the error detecting unit 25 detects the error of the digital signal, it is preferable to prohibit the application of the control voltage from the control voltage generating unit 24 to the voltage controlled oscillator 22.

Figure 2:
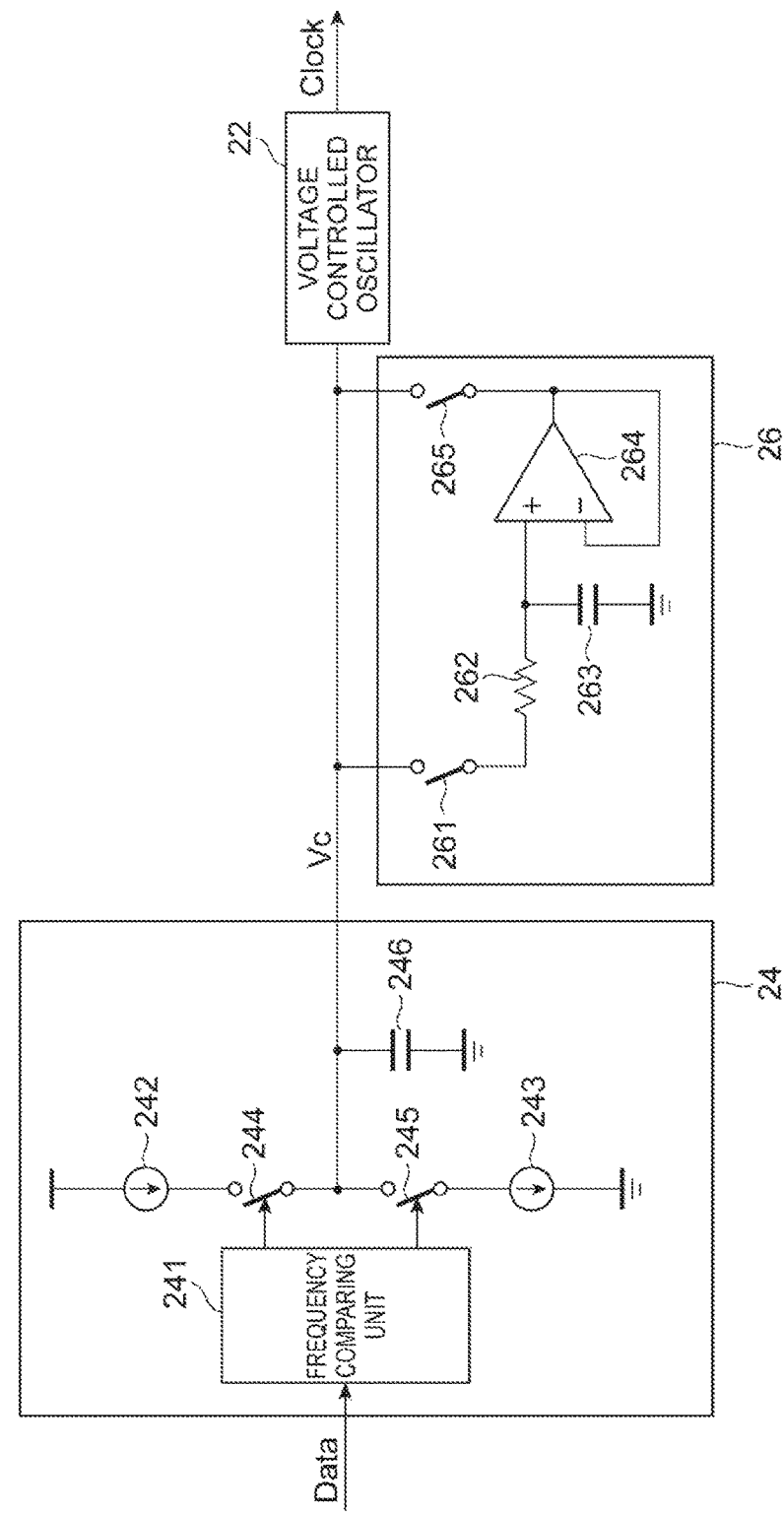
FIG. 2 is a diagram illustrating configurations of a control voltage generating unit 24 and a control voltage holding unit 26.

FIG. 2 is a diagram illustrating configurations of the control voltage generating unit 24 and the control voltage holding unit 26. The control voltage generating unit 24 includes a phase/frequency comparing unit 241, a charge pump including current sources 242 and 243 and switches 244 and 245, and a loop filter including a capacitive element 246. The phase/frequency comparing unit 241 obtains a relationship of a phase or a frequency between the data and the clock on the basis of data obtained by oversampling or the like in the sampling unit 23. The charge pump closes one of the switches 244 and 245 for a fixed time according to a relationship of the phase or the frequency between the data and the clock obtained by the phase/frequency comparing unit 241 to output a current pulse of charging or discharging to the loop filter. The loop filter increases/decreases an output voltage (a control voltage Vc) through charging or discharging of the capacitive element 246 by the charge pump.

The control voltage holding unit 26 includes a switch 261, a resistor 262, a capacitive element 263, an amplifier 264, and a switch 265. The amplifier 264 includes a first input terminal (a non-inverting input terminal), a second input terminal (an inverting input terminal), and an output terminal. The first input terminal of the amplifier 264 is connected to an output terminal of the control voltage generating unit 24 via the switch 261 and the resistor 262 connected in series and connected to a ground potential via the capacitive element 263. When the switch 261 transitions from a closed state to an opened state, the first input terminal of the amplifier 264 can hold the control voltage Vc immediately before the transition. The second input terminal of the amplifier 264 and the output terminal of the amplifier 264 are connected to each other. When the switch 265 is in the closed state, a voltage value of the output terminal of the amplifier 264 can be provided to the voltage controlled oscillator 22.

When a digital signal is transmitted from the transmitting device 10 to the receiving device 20 through the transmission path 30 in the conventional CDR, if noise temporarily overlaps a digital signal due to an external factor such as static electricity (if the digital signal is erroneous), the control voltage Vc provided from the control voltage generating unit 24 to the voltage controlled oscillator 22 has an erroneous value and the clock output from the voltage controlled oscillator 22 also has an erroneous frequency, and thus the data and the clock recovered at that time are incorrect. Also, even if the error detecting unit 25 detects an error of the digital signal and stops control voltage value control by the control voltage generating unit 24, the control voltage Vc has an erroneous value and the recovered data and clock are similarly incorrect due to a leaked current or thermal noise applied to a control voltage input node of the voltage controlled oscillator 22. When the digital signal returns from an abnormal case to a normal case, it is possible to recover a clock having an original frequency/phase and recover data having an original value. However, because the control voltage Vc has an error value immediately after the digital signal returns from the abnormal case to the normal case, the output clock also has an erroneous frequency and the recovered data may be incorrect even when the digital signal is normal. Because a control voltage value is controlled by charging/discharging of the capacitive element 246 by the charge pump, a fixed time is required to return from an erroneous control voltage value to a normal control voltage value. At this time, when the control of the charge pump is based on erroneously recovered data, charging/discharging of the capacitive element 246 is not appropriately performed and returning to a normal control voltage value is time-consuming. Consequently, recovering the original data and clock after the temporary overlap of noise in the digital signal is eliminated may be time-consuming.

Therefore, the receiving device 20 of the present embodiment includes an error detecting unit 25 and a control voltage holding unit 26. When the error detecting unit 25 detects an error of a digital signal on the basis of a pattern of data output from the sampling unit 23, the switch 261 transitions from the closed state to the opened state in the control voltage holding unit 26 and the switch 265 transitions from the opened state to the closed state. Thereby, the control voltage holding unit 26 holds a control voltage before the error detection in the first input terminal of the amplifier 264 and the held control voltage is output from the output terminal of the amplifier 264 and provided to the voltage controlled oscillator 22.

In a period in which the control voltage held by the control voltage holding unit 26 is provided to the voltage controlled oscillator 22, a control voltage provided to the voltage controlled oscillator 22 may be held at an appropriate value even when frequency comparison in the control voltage generating unit 24 is erroneous or even when current leakage or thermal noise is present in the voltage controlled oscillator 22.

When the error detecting unit 25 ends error detection of the digital signal, the switch 261 transitions from the opened state to the closed state and the switch 265 transitions from the closed state to the opened state in the control voltage holding unit 26. Thereby, the control voltage Vc output from the control voltage generating unit 24 is generally provided to the voltage controlled oscillator 22.

Therefore, in the present embodiment, it is possible to shorten a time required to recover the original data and clock from a digital signal after the temporary overlap of noise in the digital signal is eliminated and improve transmission characteristics as a result.

Figure 3:
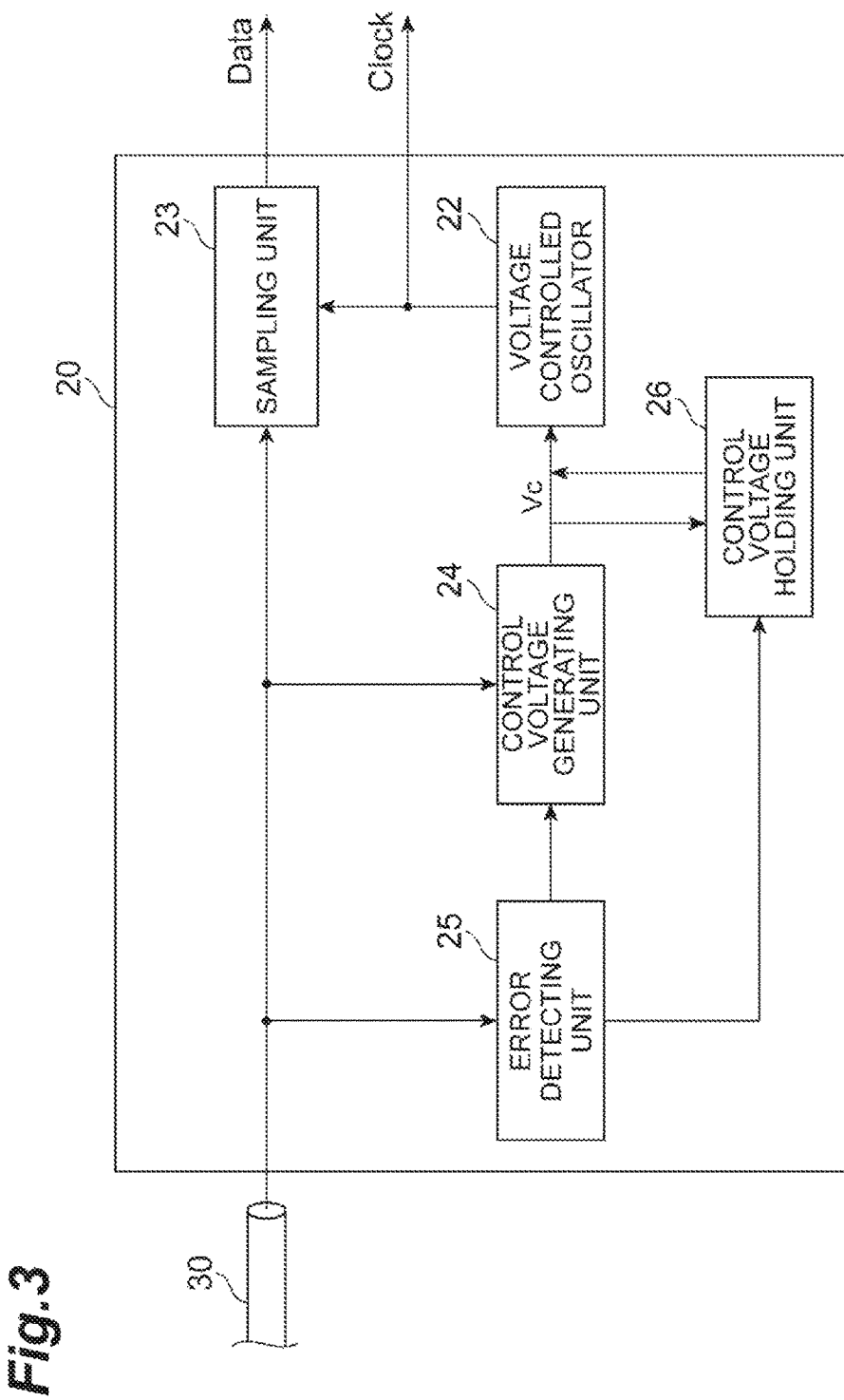
FIG. 3 is a diagram illustrating a configuration of a receiving device 20 of a modified example.

FIG. 3 is a diagram illustrating a configuration of a receiving device 20 of a modified example. While the error detecting unit 25 of the receiving device 20 illustrated in FIG. 1 detects an error of a digital signal on the basis of a pattern of data output from the sampling unit 23, the error detecting unit 25 of the receiving device 20 illustrated in FIG. 3 detects the error of the digital signal on the basis of a voltage value of a received digital signal. That is, when the voltage value of the digital signal deviates from a voltage range during a normal operation, the error detecting unit 25 can detect that the digital signal is erroneous. When the transmission path 30 is a differential line, the error detecting unit 25 may monitor whether a voltage value of either of two lines constituting the differential line deviates from a voltage range during the normal operation and monitor whether a difference between voltage values of the two lines deviates from a voltage range during the normal operation.

Also, while the control voltage generating unit 24 of the receiving device 20 illustrated in FIG. 1 obtains a phase or frequency difference between the data output from the sampling unit 23 and the clock output from the voltage controlled oscillator 22, the control voltage generating unit 24 of the receiving device 20 illustrated in FIG. 3 obtains a phase or frequency difference between the received digital signal and the clock output from the voltage controlled oscillator 22.

Even in this case, when the error detecting unit 25 detects the error of the digital signal, the receiving device 20 provides the control voltage before error detection held by the control voltage holding unit 26 to the voltage controlled oscillator 22. Thereby, it is possible to shorten a time required to recover the original data and clock from a digital signal after the temporary overlap of noise in the digital signal is eliminated and improve transmission characteristics as a result.

The present invention is not limited to the above-described embodiment and various modifications are possible. For example, when the error detecting unit 25 detects an error of a digital signal, a control voltage from the control voltage holding unit 26 may be immediately provided to the voltage controlled oscillator 22 and the control voltage from the control voltage holding unit 26 may be provided to the voltage controlled oscillator 22 when a period in which the error detecting unit 25 detects the error of the digital signal continues across a fixed time or more. Also, a control voltage from the control voltage generating unit 24 may be returned to be provided to the voltage controlled oscillator 22 when the error detecting unit 25 ends the error detection of the digital signal, and the control voltage from the control voltage generating unit 24 may be returned to be provided to the voltage controlled oscillator 22 when a fixed time has elapsed from a time at which the error has been detected.

INDUSTRIAL APPLICABILITY

The present invention can be applied to a receiving device capable of shortening a time required to recover the original data and clock from a digital signal after the temporary overlap of noise in the digital signal is eliminated.

REFERENCE SIGNS LIST

1 Transmitting/receiving system
10 Transmitting device
20 Receiving device
22 Voltage controlled oscillator
23 Sampling unit
24 Control voltage generating unit
25 Error detecting unit
26 Control voltage holding unit
30 Transmission path

The invention claimed is:
1. A receiving device for receiving a digital signal transmitted from a transmitting device and arriving via a transmission path, the receiving device comprising:
  a voltage controlled oscillator configured to input a control voltage and output a clock of a frequency according to a value of the control voltage;
  a sampling unit, implemented by at least one processor, configured to input the digital signal, input the clock output from the voltage controlled oscillator, and sample and hold data of the digital signal at a timing indicated by the clock to output the sampled and held data;
  a control voltage generating unit configured to obtain a phase or frequency difference between the digital signal or the data and the clock and generate the control voltage having a value of a small difference to output the generated control voltage to the voltage controlled oscillator;
  an error detecting unit configured to detect an error of the digital signal; and
  a control voltage holding unit configured to hold a value of the control voltage output from the control voltage generating unit and provide a control voltage maintained before error detection to the voltage controlled oscillator when the error detecting unit detects an error of the digital signal.

2. The receiving device according to claim 1, wherein, when the error detecting unit detects the error of the digital signal, the application of the control voltage from the control voltage generating unit to the voltage controlled oscillator is prohibited.

3. The receiving device according to claim 1,
wherein the control voltage holding unit includes an amplifier having a first input terminal, a second input terminal, and an output terminal and holds a control voltage in the first input terminal, and
wherein the second input terminal and the output terminal are connected to each other and provide a voltage value of the output terminal to the voltage controlled oscillator.

4. The receiving device according to claim 1, wherein the error detecting unit detects the error of the digital signal on the basis of a pattern of data output from the sampling unit.

5. The receiving device according to claim 1, wherein the error detecting unit detects the error of the digital signal on the basis of a voltage value of the received digital signal.

6. A transmitting/receiving system comprising:
a transmitting device configured to transmit a digital signal; and
a receiving device for receiving the digital signal transmitted from the transmitting device and arriving via a transmission path, the receiving device comprising:
a voltage controlled oscillator configured to input a control voltage and output a clock of a frequency according to a value of the control voltage;
a sampling unit, implemented by at least one processor, configured to input the digital signal, input the clock output from the voltage controlled oscillator, and sample and hold data of the digital signal at a timing indicated by the clock to output the sampled and held data;
a control voltage generating unit configured to obtain a phase or frequency difference between the digital signal or the data and the clock and generate the control voltage having a value of a small difference to output the generated control voltage to the voltage controlled oscillator;
an error detecting unit configured to detect an error of the digital signal; and
a control voltage holding unit configured to hold a value of the control voltage output from the control voltage generating unit and provide a control voltage maintained before error detection to the voltage controlled oscillator when the error detecting unit detects an error of the digital signal.

* * * * *